United States Patent [19]

Suzuki

[11] Patent Number: 6,117,752
[45] Date of Patent: Sep. 12, 2000

[54] METHOD OF MANUFACTURING POLYCRYSTALLINE SEMICONDUCTOR THIN FILM

[75] Inventor: Kouji Suzuki, Yokohama, Japan

[73] Assignee: Kabushiki Kaisha Toshiba, Kawasaki, Japan

[21] Appl. No.: 09/132,056

[22] Filed: Aug. 11, 1998

[30] Foreign Application Priority Data

Aug. 12, 1997 [JP] Japan .................................. 9-217213

[51] Int. Cl.$^7$ ................................................ H01L 29/04
[52] U.S. Cl. ...................... 438/487; 438/478; 438/489; 438/487; 438/486; 438/150; 257/49; 257/51; 257/52
[58] Field of Search ................................. 438/488, 478, 438/487, 486, 150, 149; 257/49, 51, 52

[56] References Cited

U.S. PATENT DOCUMENTS 5,589,406 12/1996 Kato et al. ................................. 437/21
5,808,318 9/1998 Masumo et al. ........................... 257/66
6,002,523 9/1998 Tanaka ..................................... 359/624

FOREIGN PATENT DOCUMENTS 7-176757 7/1995 Japan .

OTHER PUBLICATIONS

R. Mukai et al. "Single crystalline SOI square Island fabrication by laser . . . " Material Res. Soc. Symp. Proc. vol. 35 1985. p. 663–668.

M. Geis et al. "Crystallographic orientation of silicon on an amorphous substrate." Appl. Phys. Lett. vol. 35 Jul. 1, 1979 p. 71–74.

H. Lam et al. "Single crystal silicon–on–oxide by a Scanning CW laser . . . " Journ. of Electrochem. Soc. Sep. 1981 p. 1981–1986.

K. Egami et al. "Two–step laser recrystallization of silicon stripes in SiO2 grooves . . . " Material Res. Soc. Symp. Proc. vol. 35 1985 p. 696–674.

K. Ishikawa, et al., Extended Abstracts (The 44$^{th}$ Spring Meeting, 1997): The Japan Society of Applied Physics and Related Societies, vol. 2, p. 791, Mar. 28, 1997.

Primary Examiner—Matthew Smith
Assistant Examiner—Granvill Lee
Attorney, Agent, or Firm—Oblon, Spivak, McClelland, Maier & Neustadt, P.C.

[57] ABSTRACT

There is provided the method of manufacturing a polycrystalline semiconductor thin film, in which an amorphous semiconductor thin film is formed on an insulating substrate, and the amorphous semiconductor thin film is transformed into a polycrystalline semiconductor thin film. In this method, an energy beam is irradiated onto a predetermined region of the amorphous semiconductor thin film via a mask prepared by forming energy beam transmitting regions on a transparent plate as a plurality of patterns, and the region on which the energy beam is irradiated is changed so as to move the predetermined region on the amorphous semiconductor thin film in order.

18 Claims, 8 Drawing Sheets

METHOD OF MANUFACTURING POLYCRYSTALLINE SEMICONDUCTOR THIN FILM

BACKGROUND OF THE INVENTION

The present invention relates to a method of manufacturing a polycrystalline semiconductor thin film for a thin film transistor used for a liquid crystal display panel etc., and an apparatus for manufacturing such a thin film.

Liquid crystal display devices are made thin in dimensions and light in weight, and have characteristics such as that they can be driven at a low voltage and a color display can be easily achieved. With such characteristics, they are recently used as display devices of, for example, personal computers and word processors. Of all the types of the liquid crystal display apparatus, a so-called active matrix type liquid crystal display device in which a thin film transistor (TFT) is provided for each and every pixel as a switching element, is presently the optimal display mode as a display apparatus for a full color television or an OA device. This is because even if the number of pixels is increased in the active matrix type apparatus, deterioration of the contrast, response and the like does not significantly occur, and further this type of apparatus is able to display a half tone (gray scale).

The active matrix type liquid crystal display apparatus has a structure in which two glass substrates (more specifically, an array substrate on which a plurality of pixel electrodes and transistors are formed in matrix, and a common electrode substrate opposing to the array substrate) and a liquid crystal layer interposed between these substrates.

More specifically, on one of the glass substrates, that is, on the common electrode substrate, color filters arranged to correspond to pixels, and transparent electrodes (common electrodes) are formed. On the other array substrate, pixel electrodes made of transparent electrodes arranged in matrix, and TFTs whose source electrodes are connected respectively to the pixel electrodes are provided. The gate electrodes of the TFTs are connected to address lines arranged in the X direction, and the drain electrodes thereof are connected to data lines arranged in a direction (Y direction) intersecting with the address lines at right angles.

In the liquid crystal display apparatus having the above-described structure, as an address signal and a data signal are applied respectively to address lines and data lines each at a predetermined timing, a voltage which corresponds to an image displayed, is applied to a respective pixel electrode. Thus, the alignment of liquid crystal, that is, the light transmittance, can be controlled on the basis of a potential difference between a common electrode and a pixel electrode, and thus a desired image can be displayed. For details, an article written by T. P. Brody et al., (IEEE Trans. On Electron Devices. Vol.ED-20. Nov. 1973. pp.995–1001) should be referred to.

As the semiconductor material for the conventional TFT, amorphous silicon or polycrystalline silicon is presently used. In particular, the active matrix-type liquid crystal display device, which employs polycrystalline silicon has a structure in which the drive circuit for applying a drive signal to gate lines and data lines, can be formed within the same substrate as the liquid crystal element. Therefore, the size of the display panel can be reduced, and the reliability of the connection between wiring lines can be made high.

Figure 1:
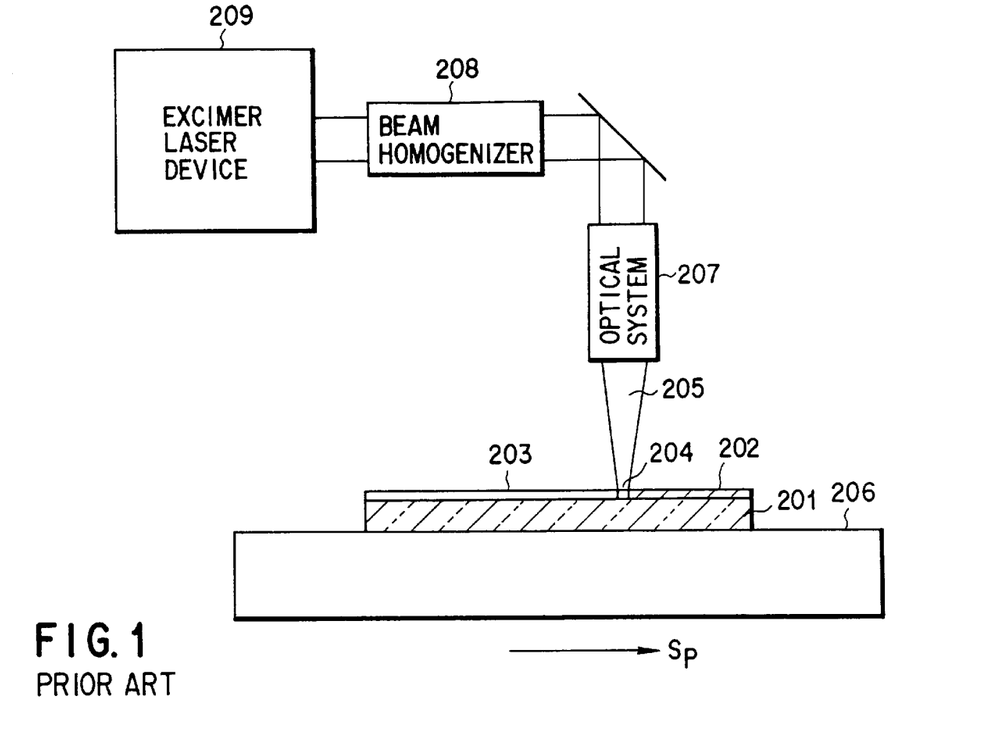
FIG. 1 is a schematic diagram illustrating a conventional method of manufacturing a polycrystalline silicon thin film.

FIG. 1 illustrates a method of forming a conventional polycrystalline silicon thin film. A laser beam output from an excimer laser device 209 is irradiated via a beam homogenizer 208 and an optical system 207, on an amorphous silicon layer 203 formed on a glass substrate 201, and thus the amorphous silicon thin film is annealed and transformed into a polycrystalline silicon film 202.

In order to improve the uniformity, a laser beam 205 is converted into a beam 204 having a slender and lengthy shape by the optical system 207 via the beam homogenizer 208, and then irradiated on the surface of the silicon thin film 203. The amorphous silicon layer 203 is melted by the laser energy, and then crystallized in the process of solidification. The laser pulse width is as short as 20 to 30 nanoseconds, and therefore amorphous silicon can be crystallized without increasing the temperature of the substrate much. For this reason, a glass substrate can be used as the substrate 201. As laser annealing is carried out while sending a stage 206 in the X direction at a sending pitch Sp and scanning it in the Y direction, a polycrystalline silicon thin film 202 can be formed on the entire surface of the substrate.

Figure 2A:
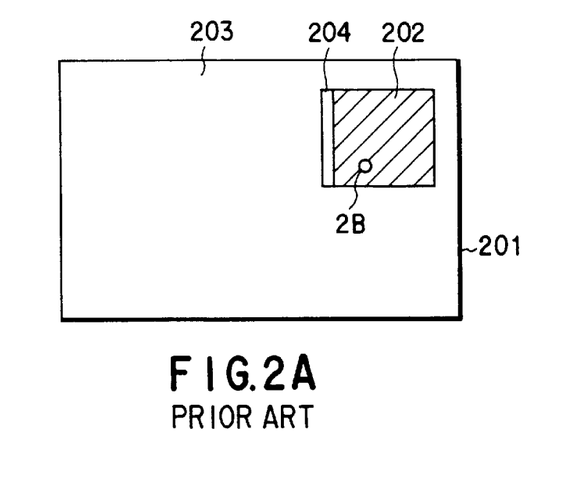
FIG. 2A is a plan view of a silicon thin film, designed to illustrate the conventional method of manufacturing a polycrystalline silicon thin film.
Figure 2B:
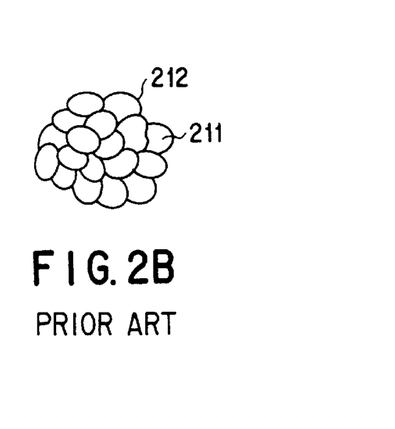
FIG. 2B is an enlarged view of a section 2B in FIG. 2A.

FIG. 2A is a plan view of the substrate 201. FIG. 2B shows an enlarged view of the section 2B in FIG. 2A. In the region irradiated with the lengthy beam 204, a polycrystalline silicon thin film 202 can be obtained. However, the melting/solidification phenomenon of the silicon thin film occurs extremely quickly, and also an enormous number of initial nuclei to grow to be polycrystalline silicon are present in the substrate. Consequently, the size of crystal grains thus obtained is as small as about 0.2 to 0.3 $\mu$m. As a result, a great number of grain boundaries are created as can be seen in FIG. 2B, which give rise to boundaries for crystal grains 211. Therefore, it becomes difficult to obtain a TFT of a high mobility.

Therefore, it is inevitable that the drive circuit formed integrally with the periphery of the substrate of the liquid crystal display device should be designed with TFTs having a low mobility. Further, in order to process a high-speed display signal, it is necessary to use a plurality of parallel circuits and therefore the area of the drive circuit region increases.

In the case where a high speed operation is required, a special crystal silicon IC is provided on an outer side of the polycrystalline silicon TFT drive circuit. Further, the grain boundaries 12 contains a great number of defects, which causes dispersion of threshold voltage Vth of TFT, and therefore it is difficult to realize a high-efficiency analog circuit. Consequently, it is conventionally not possible to form a circuit necessary for digitally driving a liquid crystal display device, such as a digital-analog converter.

Figures 3A, 3B:
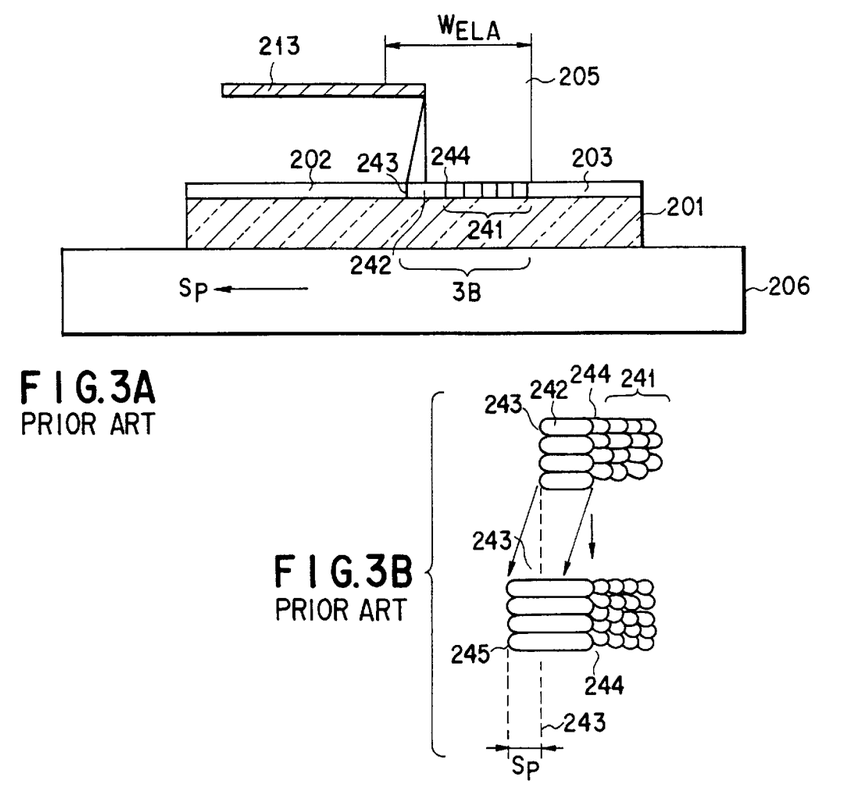
FIG. 3A is a schematic diagram for illustrating another conventional method of manufacturing a polycrystalline silicon thin film.
FIG. 3B is an enlarged plan view of a section 3B in FIG. 3A.

In order to improve the TFT characteristics, it is important to realize a method of preparing polycrystalline silicon having great crystal grains. FIG. 3A shows an example of such a method, in which a blank mask 213 is provided in an optical path of an irradiation beam 205 in order to create a temperature gradient within the surface of the polycrystalline silicon layer 202, thus making it possible to increase the size of the grains. It should be noted that in FIG. 3A, $W_{ELA}$ is a beam width, which is a shorter side of the lengthy beam.

In more detail, in the surface portion of the. polycrystalline silicon layer 202, located directly underneath a blank mask 213, a polycrystalline silicon region 242 located at about 1 $\mu$m or less from the mask edge is melted due to the light beam coming around there. However, since the melting energy in the region 242 is low, the temperature of the region 242 becomes lower than that of the region 244, thus creating a large temperature gradient regionally in the surface of the silicon layer 203. As such a temperature gradient is created, the solidification starts from an area 243 having a lower temperature, and the crystal growth occurs from the area 243 as the starting point. Therefore, a larger grain diameter as compared to the case shown in FIG. 1 can be obtained; however this conventional technique was not very much practical due to the below-described drawback.

That is, since the temperature gradient is created regionally, the crystal grains grow only to have sizes of about 1 to 3 μm. Further, the grain diameter increases only in the direction vertical to the mask edge, and in terms of the direction parallel thereto, the grain diameters are still as small as 0.2 to 0.3 μm. In the case where the grain diameter is increased by scanning the substrate, the substrate sending pitch Sp should be set such that the mask edge (end) does not go beyond the closest grain boundary as shown in FIG. 3B, and the grain diameter must be made as small as about 0.5 μm. When the entire surface of a substrate having a size of 300×400 mm is processed at such a pitch, it requires about 90 minutes under a laser oscillation of 300 Hz even if a beam having a length of 150 mm is used. Thus, the above-described technique requires a great amount of time for processing the entire surface of a large area substrate, and therefore the technique is not suitable for the manufacture of polycrystalline silicon.

Therefore, the application of a liquid crystal panel of the type in which a drive circuit made of polycrystalline silicon TFTs is built in, is limited to a small size liquid crystal such as of about 1 to 3 inches diagonally across, which does not require a high speed operation, that is, for example, a projection type liquid crystal display device. Thus, it is difficult to apply such a panel to a panel larger in size than that mentioned above.

BRIEF SUMMARY OF THE INVENTION

The first object of the present invention is to provide a method of manufacturing a polycrystalline semiconductor thin film, capable of manufacturing a thin film of polycrystalline silicon having a large grain diameter, at high productivity.

The second object of the present invention is to provide an apparatus for manufacturing a polycrystalline semiconductor thin film, with which the performance of the polycrystalline silicon TFT is improved, the operation speed of the drive circuit can be increased, the thin film can be applied to a large-size liquid crystal display device, and the resolution of the display can be made finer.

In order to achieve the first object of the present invention, there is provided, according to the first object of the present invention, a method of manufacturing a polycrystalline semiconductor thin film, comprising the steps of:

forming an amorphous semiconductor thin film on an insulating substrate;

irradiating an energy beam on a predetermined region of the amorphous semiconductor thin film, via a mask in which an energy beam transmitting region is formed as a plurality of patterns on a transparent plate, so as to convert the amorphous semiconductor thin film into a polycrystalline semiconductor thin film; and changing a region on which the energy beam is irradiated so as to move the predetermined region on the amorphous semiconductor thin film.

With regard to the above method, it is preferable that the step of irradiating the energy beam on the predetermined region of the amorphous semiconductor thin film, includes a step of irradiating the energy beam via the mask in which repetitious patterns of stripes are formed.

Further, with regard to the above method, it is possible that the step of irradiating the energy beam includes a first step of irradiating the energy beam a plurality of times, and the step of changing the region on which the energy beam is irradiated, includes a second step of moving the substrate by a first predetermined distance.

Furthermore, with regard to the above method, it is possible that the method further comprises a third step of moving the substrate at a second pitch, after the first step and the second step are repeated a plurality of times.

Furthermore, with regard to the above method, it is possible that the second step includes a step of moving the substrate in a direction substantially vertical to a direction of the stripes.

Furthermore, with regard to the above method, it is possible that the step of irradiating the energy beam onto the amorphous semiconductor thin film, includes a step of using a mask in which the plurality of patterns are divided into a plurality of regions and different patterns are formed respectively in the plurality of regions.

Furthermore, with regard to the above method, it is possible that the step of irradiating the energy beam on the amorphous semiconductor thin film includes a first step of irradiating the predetermined region using one of the plurality of patterns formed respectively in the plurality of regions; the step of changing the region on which the energy beam is irradiated includes a second step of moving the substrate by a predetermined distance such that the predetermined region is irradiated via another pattern adjacent to the one of the plurality of patterns, and the first step and the second step are repeated so as to irradiate the energy beam on the predetermined region of the amorphous semiconductor thin film via each of the plurality of patterns.

Furthermore, with regard to the above method, it is possible that the plurality of patterns divided into the plurality of regions include repetitious patterns, and the repetitious patterns are set in different directions between at least two regions of the plurality of regions.

Furthermore, with regard to the above method, it is possible that the plurality of patterns divided into the plurality of regions have a plurality of openings formed at a predetermined pitch common to the plurality of regions, the plurality of openings having substantially the same size in each of the plurality of regions, and being of similar patterns of different sizes among the plurality of regions; and the second step of moving the substrate by the predetermined distance, includes a step of moving the substrate at a pitch of the predetermined distance such that the similar patterns of different sizes in the plurality of regions are aligned with each other in an increasing order of the size.

Furthermore, with regard to the above method, it is preferable that the plurality of patterns divided into the plurality of regions form a polka dot pattern in which the plurality of openings are arranged at intersections of a lattice.

Furthermore, with regard to the above method, it is possible that the step of irradiating the energy beam on the predetermined region of the amorphous semiconductor thin film, includes a step of irradiating the energy beam via a mask in which zigzag repetitious patterns are formed.

Furthermore, with regard to the above method, it is possible that the step of irradiating the energy beam includes a first step of irradiating the energy beam a plurality of times, and the step of changing the region on which the energy beam is irradiated, includes a second step of moving the substrate by a first predetermined distance.

Furthermore, with regard to the above method, it is possible that the method further comprising a third step of moving the substrate at a second pitch, after the first step and the second step are repeated a plurality of times.

Furthermore, with regard to the above method, it is possible that the step of irradiating the energy beam onto the predetermined region of the amorphous semiconductor thin film, includes a step of irradiating the energy beam, using repetitious patterns of stripes made of a transparent inorganic material and formed on the semiconductor thin film, as a mask.

Furthermore, with regard to the above method, it is possible that the step of irradiating the energy beam includes a first step of irradiating the energy beam a plurality of times, and the step of changing the region on which the energy beam is irradiated, includes a second step of moving the substrate by a first predetermined distance.

According to the second aspect of the present invention, there is provided an apparatus for manufacturing a polycrystalline semiconductor thin film, comprising:

- a substrate holder table on which an amorphous semiconductor thin film formed on an insulating substrate is placed;
- energy beam generating means for irradiating an energy beam onto the amorphous semiconductor thin film so as to melt the same for re-crystallization, thus forming a polycrystalline semiconductor thin film;
- supporting means, provided between the semiconductor thin film and the energy beam generating means, for supporting a mask in which a pattern for blocking the energy beam is formed on a transparent plate;
- a beam projecting optical system, provided between the semiconductor thin film and the energy beam generating means, for projecting the energy beam modulated by the mask on the semiconductor thin film in accordance with the pattern; and
- substrate moving means for moving the insulating substrate at a predetermined pitch after the energy beam is irradiated.

Furthermore, with regard to the above apparatus, it is possible that the substrate moving means includes means for moving the substrate at two or more predetermined pitches.

Furthermore, with regard to the above apparatus, it is possible that the projection optical system includes a mechanism of reduction-irradiating the energy beams, which pass through the mask, on a surface of the semiconductor thin film.

Furthermore, with regard to the above apparatus, it is possible that the projection optical system includes a mechanism of irradiating the energy beams, which pass through the mask at an equal magnification, on a surface of the semiconductor thin film.

Furthermore, with regard to the above apparatus, it is possible that the apparatus further comprise detecting means for detecting a positioning pattern on the insulating substrate before the insulating substrate is moved at the predetermined pitch, and positioning means for positioning the energy beam and the substrate with each other.

With the above described structure of the present invention, a polycrystalline silicon thin film having large sized grains can be manufactured while improving the productivity. Thus, the characteristics of TFTs can be improved and the uniformity of the TFTs can be achieved. In the case where these TFTs are applied to a drive circuit integrated type liquid crystal display apparatus, higher speed drive circuits can be achieved with a relatively small number of drive circuits used in parallel, and therefore an apparatus having a smaller frame region can be achieved. Further, the dispersion of the threshold values of TFTs can be reduced, and the lowering of the values can be achieved. Consequently, the drive voltage can be lowered, and a liquid crystal display apparatus operating under a lower power consumption can be achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

The present invention is directed to a method of forming a polycrystalline silicon thin film by an excimer laser anneal, with which a high speed operation can be achieved, and large grain diameters can be obtained. More specifically, a mask in which repetitious patterns are formed is provided in an optical path of a laser beam (energy beam) for irradiating the silicon thin film, and thus the laser beam is irradiated on the surface of silicon with the mask pattern image, and at the same time, the substrate is sent at a predetermined pitch in synchronism with the laser irradiation. The pitch of the repetitious patterns of the mask and the pitch for sending the substrate can be set in various combinations in accordance with the size of polycrystalline grains, corresponding to the target TFT characteristics.

With the above-described structure, crystal nuclei corresponding to the mask pattern are formed at many locations at the same time in the substrate and it becomes possible to enlarge the grain diameter. In the laser beam radiation region, the creation of nucleus and crystallization can be controlled at the same time, thus achieving a high productivity. In addition, a high-performance TFT can be obtained, and a drive circuit capable of a high speed operation can be realized. Further, due to the reduction in the number of defects, the threshold value Vth of TFT becomes uniform. Therefore, the operational voltage can be lowered. Thus, a high performance analog circuit, a digital analog converter, and the like can be realized. Consequently, not only a conventional small-sized liquid crystal display device, but also a large-sized and high resolution liquid crystal display device can be achieved. Further, a lower power supply and a narrower frame can be realized.

Embodiments of the present invention will now be described in detail with reference to accompanying drawings.

(First Embodiment)

Figure 4:
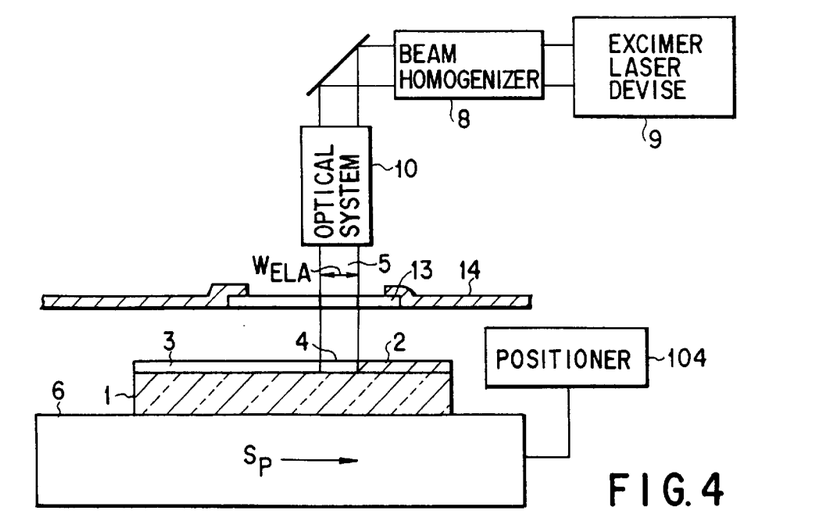
FIG. 4 is a schematic diagram for illustrating a method of manufacturing a polycrystalline silicon thin film, according to the first embodiment of the present invention.

FIG. 4 is a diagram showing the method of manufacturing a polycrystalline silicon thin film, according to the first embodiment of the present invention.

As can be seen in FIG. 4, a glass substrate 1 having a size of 300×400 mm and a thickness of 1.1 mm, is placed, and an XeCl laser beam 5 is irradiated on an amorphous silicon thin film 3 having a thickness of 50 nm, formed on the substrate 1, via a mask 13.

The laser beam (energy beam) is supplied from a laser device 9, and irradiated on the silicon thin film 3 via a beam homogenizer 8, a projection optical system 10 and the mask 13. Although it is illustrated in this figure that the mask 13 and the silicon thin film 3 are away from each other, the embodiment employs a proximity mode, and therefore the mask 13 and the silicon thin film 3 are located closely with each other. In the case of the reduction projection, the projection optical system 10 is set such that a portion thereof is located between the mask 13 and the silicon thin film 3. The mask 13 is held by a mask holder 14.

A substrate stage 6 is sent at pitch Sp in the direction indicated in the figure, and the silicon anneal region 4 is moved accordingly. It should be noted that the beam width $W_{ELA}$ is 0.5 mm (500 μm), and the length (the depth direction of page) is 100 mm. Since the pitch for sending the substrate is 50 μm, a certain section on the silicon thin film is irradiated with a laser beam ten times during the section passing through the beam width $W_{ELA}$.

The mask 13 is placed at a position 0.5 mm above the substrate, and fixed together with the laser beam 5. The applied beam changes its course to return when it hits the edge of the substrate, and thus the beam irradiates an adjacent region to be irradiated. In the case where the lengthy side (100 mm) of the beam is set in the direction of the 300-mm side of the substrate, the entire surface of a substrate can be irradiated with the beam by scanning 3 times.

The laser is oscillated at 300 Hz, and the substrate is sent at a pitch Sp for each scanning, and therefore the time required for treating the entire surface of the substrate is only 80 seconds. By contrast, with the method illustrated in FIG. 1, it takes about 5000 seconds to finish the entire surface of a substrate. Thus, it can be understood that the present invention is more appropriate for mass production.

Figure 5:
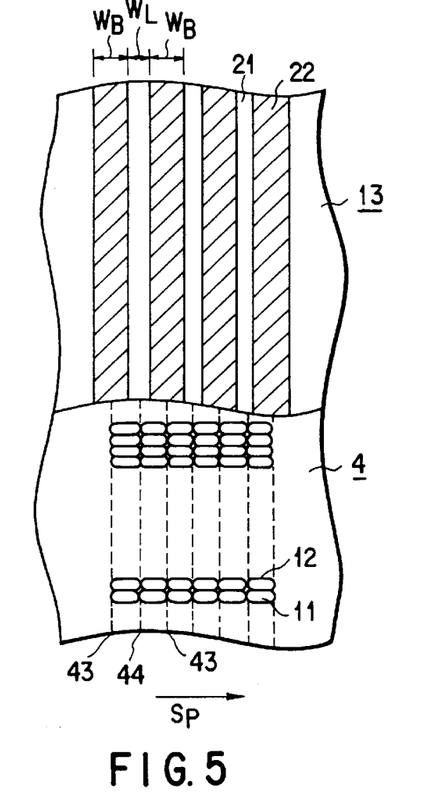
FIG. 5 is a diagram containing an enlarged view of a mask pattern obtained in the first embodiment, and a view of a state of crystal grains in an anneal region where a laser beam is irradiated via the mask, these views being placed such that the mask pattern and the state of crystal grains correspond to each other.

FIG. 5 is a diagram showing the pattern portion 13 of the mask 13 and the crystal growth region 4 formed in the silicon layer located underneath the pattern portion 13, in such a manner that the lateral axes coincide with each other, so that they can be easily compared. The mask 13 has a pattern 22 formed on a quartz substrate, and the pattern is made of a chromium film with stripes. The width WB of a pattern 22 (where beam does not transmit) is 1.5 μm, whereas the width WL of a beam transmitting region 21 is 1 μm. The laser beam 5 is irradiated in the direction parallel to the stripe pattern. In the silicon substrate located underneath the stripe pattern, crystal grains 11 and 12 each having a length of 1.2 to 1.3 μm in the direction vertical to the stripe pattern, and a width of 0.3 μm in the direction parallel thereto, are obtained as indicated by a crystal growth region 4.

Figure 6:
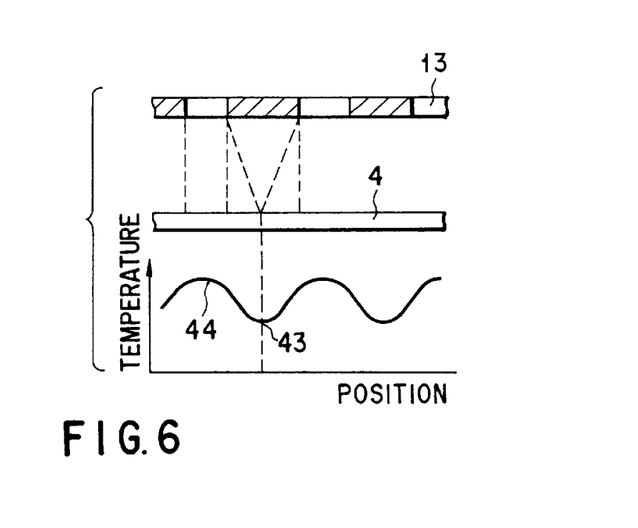
FIG. 6 is a diagram showing a temperature profile on the silicon substrate at the laser irradiation in the first embodiment.

The reason why such a large grain size is obtained can be assumed as arising from the fact that the temperature varies from one section to another non-uniformly within the surface of the silicon thin film at the irradiation of laser beam, the crystallization starts from a low temperature section 43 of the molten silicon layer (that is, directly underneath the light blocking portion of the mask) and the crystals extend to a high temperature section 44 (underneath the central portion of the opening of the mask). As can be understood from FIG. 6, the temperature is lowest at the center 43 of the region where the beam is blocked by the mask, and it is possible to start the solidification from the region 43 by irradiating energy of such a level as to generate a molten state, to that region.

The stripe pattern WB should be of about 3 μm or less, because if it is excessively large, the central portion 43 is not melted down. Further, the size of the light transmitting portion WL should be 3 μm, because if it is excessively large, the crystallization starts independently at the central portion. In this embodiment, the number of times of laser irradiation is set to 10; however the uniformity is enhanced further as the number of times increases, and therefore it is preferable that the laser irradiation should be performed as many times as possible if the limitation by the processing time allows. In addition, when the irradiation is carried out a great number of times, the influence of the defective mask can be reduced.

Further, the light blocking portion of the mask pattern may be made of a metal thin film such as tungsten and molybdenum so as to completely block the laser beam, or it may be made of a material which partially transmits a laser beam, for example, a silicon nitride film consisting of a great amount of a silicon component. In short, it is preferable that the irradiation energy should have a gradient corresponding to the mask pattern so that a planar temperature gradient is created in the silicon film of the surface irradiated with the beam.

Further, this embodiment employs a so-called proximity mode in which a mask is provided directly above the substrate; however it is also possible that a projection optical system may be inserted between the mask and the substrate. With use of the projection optical system, it becomes possible to take advantage of a reduction projection, and the controllability is further increased in the present invention where the fine pattern is used. Further, the reliability with regard to the defective mask, can be improved.

Figure 7:
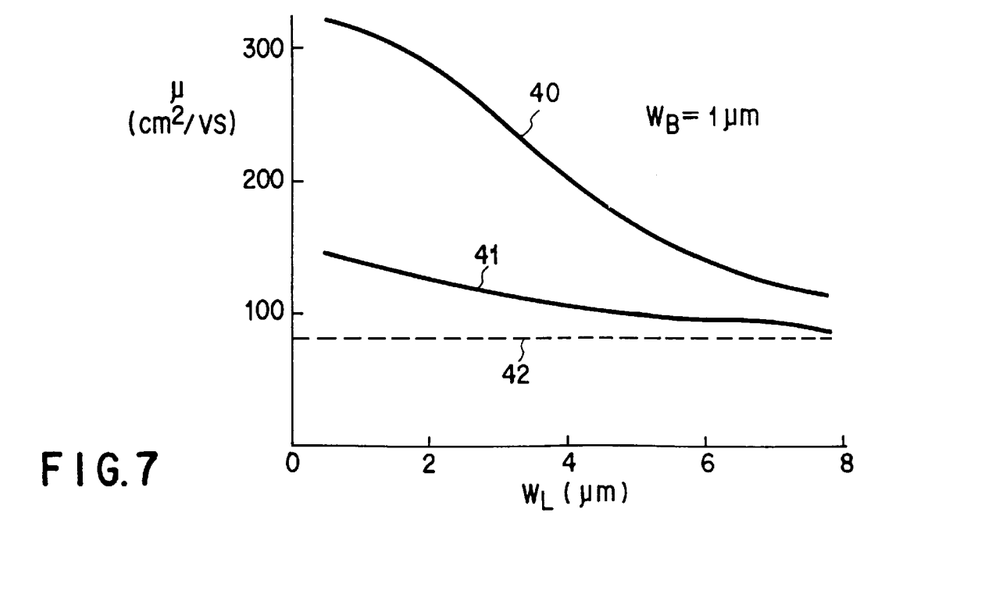
FIG. 7 is a graph illustrating the relationship between the measurements of the mask and the mobility $\mu$ of a thin film transistor formed by using the mask, in the first embodiment.

FIG. 7 is a graph illustrating the results of the evaluation of TFTs made of polycrystalline silicon thin films manufactured by this embodiment, in terms of mobility. The channel length of each TFT is 10 μm, and the width thereof is 3 μm. The characteristics of TFT vary depending upon the direction of the laser mask pattern during the annealing (or the direction of crystal grains) and the direction in which the current flows within the TFT.

Figure 8:
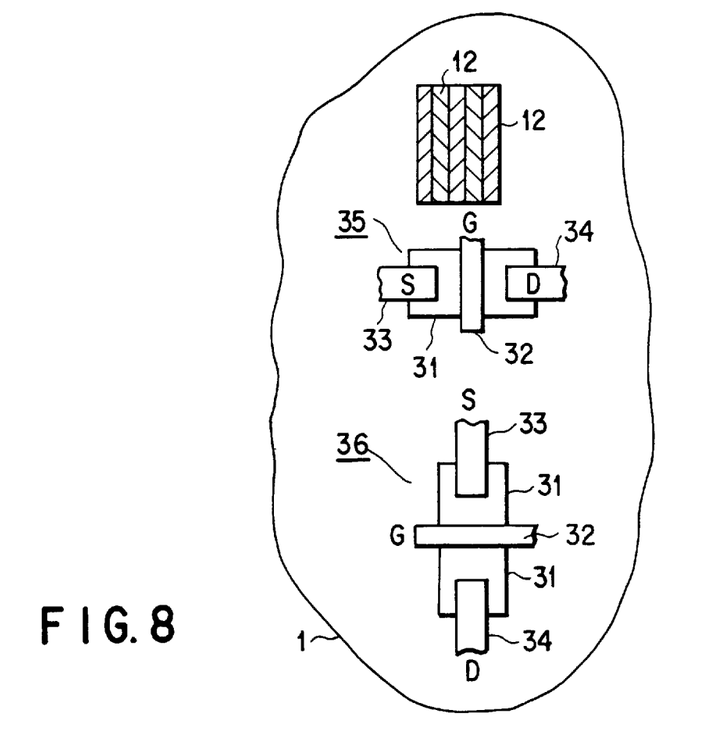
FIG. 8 is a graph illustrating the relationship between the direction of crystals of the silicon thin film and the direction in which the thin film transistor is formed, in the first embodiment.

In FIG. 7, a characteristic curve 40 indicates the result of the case such as of a TFT 36 shown in FIG. 8, where the current direction of TFT is parallel to the longitudinal direction of the crystal grains 12. It should be noted that a stripe pattern 12 schematically illustrates the shape of the crystal. A curve 41 indicates the characteristics of the case such as of TFT 35 where a TFT is placed to be vertical to the current path. A curve 42 indicates the characteristics of a reference case where polycrystalline silicon is formed by a conventional laser annealing method without using a mask.

As can be understood from FIG. 7, the mobility μ decreases as the width WL of the light transmitting region of the mask increases. This is because as the width WL increases, the number of crystal grains contained in the channel increases, and crystal grains other than those present in the mask edge portion, that is, the crystal grains present at the central portion of the light transmitting region, do not increase their size easily, and the size of them is as small as about 0.3 μm. In the case where the crystal grains are arranged such that the longitudinal direction thereof matches with the current path (curve 40), the number of grain boundaries present in the current path is naturally small, and therefore the characteristics can be improved. In both cases of the curves 40 and 41, the TFT characteristics thereof are improved as compared to the case of the curve 42 which is obtained by the conventional method. The current path of the TFT of this embodiment is placed in the direction parallel to the longitudinal direction of the crystal grains (TFT 36 shown in FIG. 8).

It should be noted that FIG. 8 contains an impurity diffusion layer 31, a gate electrode 32, a source electrode 33 and a drain electrode 34.

(Second Embodiment)

Figure 9A:
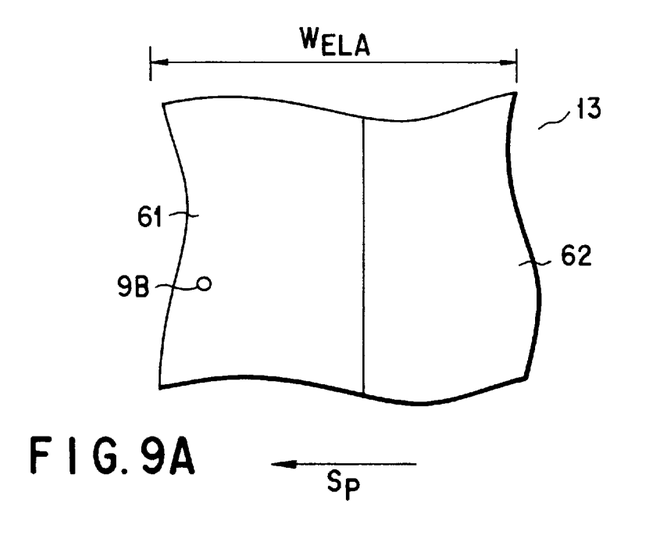
FIG. 9A is a plan view showing a part of a mask used in the method of manufacturing a polycrystalline silicon thin film, according to the second embodiment of the present invention.
Figure 9B:
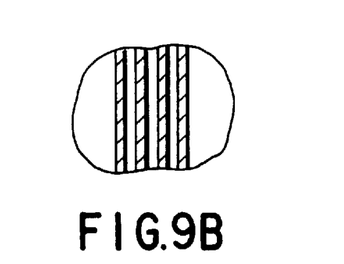
FIG. 9B is an enlarged view of a section 9B in FIG. 9A.

FIG. 9A is a partially enlarged view of a mask, designed to illustrate the method of manufacturing a polycrystalline silicon thin film according to the second embodiment of the present invention. In this embodiment, the sections different from those of the first embodiment will be mainly discussed. Further, similar structural elements to those of the first embodiment will be designated by the same reference numerals, and the detailed explanations therefor will not be repeated.

In the second embodiment, the mask 13 for the laser beam is divided into two regions 61 and 62. In the region 62, a light blocking pattern is not formed (light can transmit through the entire surface), whereas in the region 61, a stripe pattern is formed. A laser beam is irradiated on the silicon thin film in such a manner that the two regions 61 and 62 are simultaneously covered by the width $W_{ELA}$ (in the short dimensional direction) of the laser beam.

In the region 61, crystallization similar to that of the first embodiment can be obtained, whereas in the region 62, the same irradiation method as of the conventional technique is used, and therefore the enlargement of the crystal grains cannot be expected. However, in the case where the scanning direction of the substrate is set in the direction indicated by Sp in the figure, the beam of the region 62 is irradiated on the amorphous silicon, and the crystallization of small sized grains is carried out. After a while, due to the stripe pattern, large-sized grains can be obtained.

In the case where the grains are grown with use of a stripe pattern, the silicon thin film may be made polycrystalline in advance, and thus the size of grains can be stably increased. Therefore, even if the number of times of irradiation is decreased, large-sized grains can be obtained. Thus, it becomes possible to increase the scanning pitch, and the process time can be shortened.

In the second embodiment, the same pattern as that of the first embodiment is used in the region 61, and the sending pitch is set to 100 μm (beam width $W_{ELA}$: 500 μm, width of region 61 : 300 μm, width of region 62 : 200 μm); however excellent crystals can be obtained. Please note that the substrate used in this embodiment has the same size as that of the first embodiment (300×400 mm), and the process time is 40 seconds.

In the case where the entire surface is annealed by a laser beam without a mask, so as to convert it to be polycrystalline, and after a while, laser-annealing with mask, such as in the first embodiment is carried out, the same effect can be obtained.

In the second embodiment, the polycrystallization and the enlargement of the size of crystal grains can be achieved in one process, in addition to the advantages of the first embodiment.

(Third Embodiment)

FIGS. 10A to 10D are diagrams of masks, designed to illustrate the method of manufacturing polycrystalline silicon thin film according to the third embodiment of the present invention.

In the third embodiment, a mask 13 for laser beams is made in a plurality of regions 70, 71, 72, 73, . . . arranged at a pitch Mp. The region 70 is a transparent region without any pattern, and the regions 71, 72, . . . , each have a stripe pattern having WB=2 μm and WL=2 μm. In particular, the region 72 has a pattern obtained by inclining the pattern of the region 71 by an angle of θ (see FIGS. 10B and 10C).

Figure 10A:
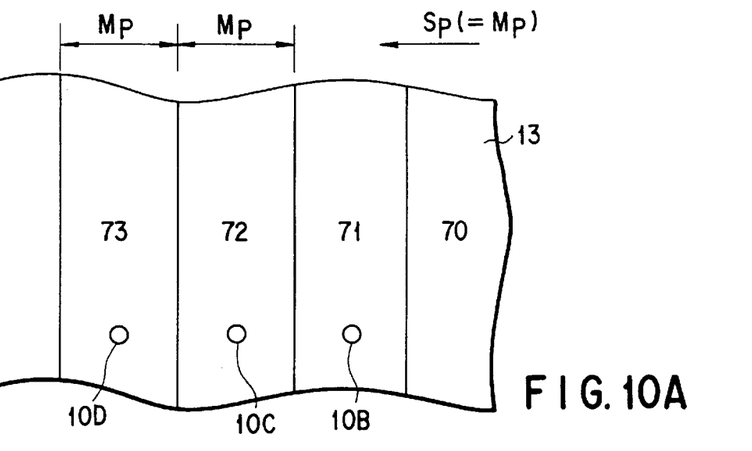
FIG. 10A is a plan view showing a part of a mask used in the method of manufacturing a polycrystalline silicon thin film, according to the third embodiment of the present invention.
Figure 10B:
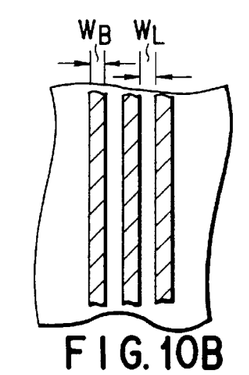
FIGS. 10B–10D are enlarged views of sections 10B, 10C and 10D, respectively, in FIG. 10A.

The laser irradiation conditions are: a laser oscillation frequency of 300 Hz, a beam width of 800 μm×100 mm, and a substrate sending pitch Sp of 160 μm. The mask pattern pitch Mp is 160 μm, which is obtained by dividing the beam width into 5 divisions. The first two patterns are regions 70, where there is no pattern, then they continue to the pattern 71, the pattern 72 (which is inclined by an angle θ of 45 degrees, and the pattern 73. The laser irradiation and the sending of the substrate are carried out in a manner that the laser irradiation is carried out 5 times and then the substrate is sent by 160 μm. Therefore, the silicon thin film is subjected to the irradiation of laser beam 5 times for each pattern, and thus the film is irradiated by laser means with 5 different types of pattern regions. Consequently, in total, the irradiation is carried out 25 times.

Figure 11A:
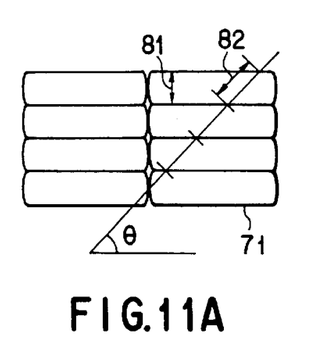
FIGS. 11A–11C are diagrams showing the states of crystal grains formed with use of masks 10B to 10D, respectively.
Figure 11B:
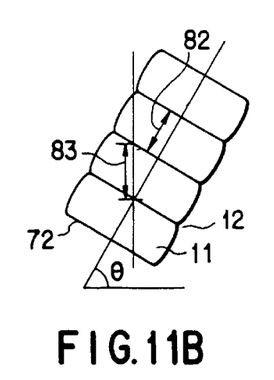
Figure 11C:
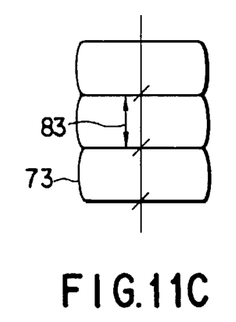

The variations of the grain size of polycrystalline silicon thus obtained are shown in FIGS. 11A to 11C. Although it is not illustrated in the figures, at the stage of the pattern region 70, polycrystalline silicon having a grain size of 0.3 μm is formed. In the pattern region 71, the grain size is increased to have a length of 2 μm and a width of 0.3 μm as shown in FIG. 11A. In the pattern region 72, the crystal grains have a size of a length of 2 μm and a width of 0.45 μm taken in the direction inclined by 45 degrees with respect to the scanning direction. In the last region 73, crystal grains having a length of 2 μm and a width of 0.6 μm taken in the scanning direction. The time required for treating the entire surface of the substrate having a size of 300×400 mm is 125 seconds.

The reason why the enlargement of the grain size occurs is that in the pattern region 72, crystals grow from crystal nuclei having a grain width 82 of the pattern region 71. It should be noted that in the region 71, the crystal grains have a dimension 81 in the short hand direction, and in the region 73, the crystal grains have a dimension 83 in the short hand direction.

Figure 10C:
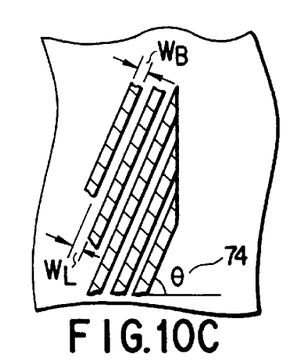
Figure 10D:
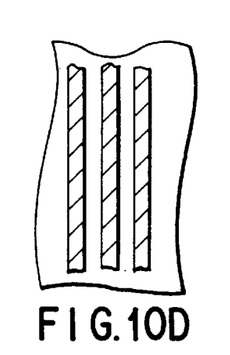

The enlargement of the width of the crystal grains increases more as the inclination angle θ of the pattern of the region 72 is small; however at the same time, the frequency of generating crystal grains having a small grain width is increased. Therefore, the inclination angle θ should be in a range of 0 to 60 degrees. In this embodiment, the inclination angle is 45 degrees.

(Fourth Embodiment)

FIGS. 12A to 12E are diagrams illustrating the method of forming a polycrystalline silicon thin film according to the fourth embodiment of the present invention.

In the fourth embodiment, a laser beam mask 13 is divided into a plurality of blocks arranged at a pitch Mp. A region 90 has no pattern, and a region 91 has circular patterns each having a diameter of C1 arranged at a pitch dp1 in the substrate scanning direction, and at a pitch dp2 in the direction vertical to the scanning direction. The arrangement pitch of the circular patterns in the regions 92, 93, . . . , is the same as that of the region 91; however the diameter of the circular pattern in the respective regions increases as C2, C3, . . . , in this order.

Figure 12A:
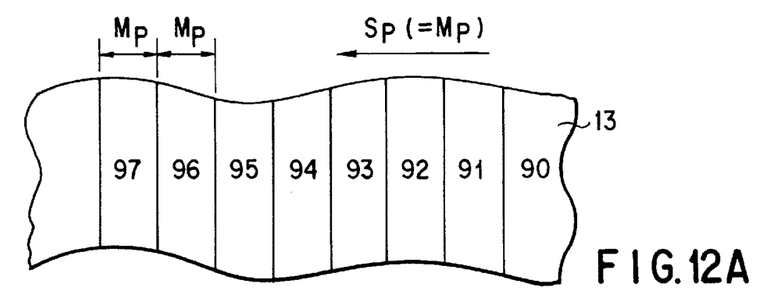
FIG. 12A is a plan view showing a part of a mask used in the method of manufacturing a polycrystalline silicon thin film, according to the fourth embodiment of the present invention.
Figure 12B:
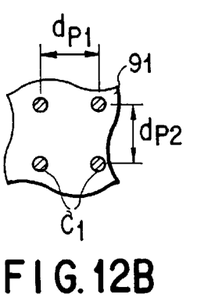
FIGS. 12B–12E are enlarged views of masks formed in connection with regions 91, 92, 93 and 97, respectively, in FIG. 12A.
Figure 12C:
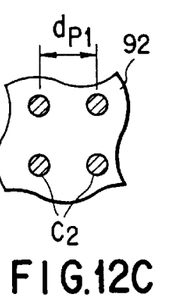
Figure 12D:
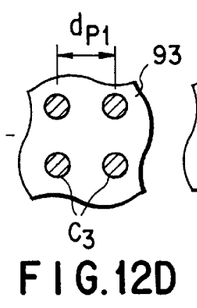
Figure 12E:
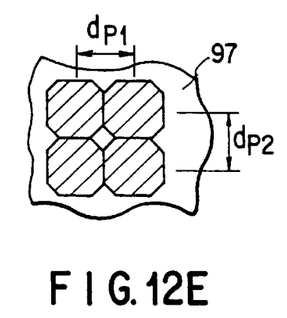

The mask is disposed such that the light beam is irradiated onto the surface of the silicon substrate at a reduction exposure of 5 to 1. In the fourth embodiment, relative to the dimensions of the irradiated surface (of the silicon film), Mp is 500 μm, dp1 and dp2 are both 10 μm, and C1, C2, C3, . . . are respectively 1 μm, 2 μm, 3 μm . . . . With these values, the final pattern is as shown in the region 97. The size of the laser beam at the irradiated surface is 20 mm in length and 7 mm in width.

The laser irradiation conditions are: an oscillation frequency of 300 Hz and a substrate sending pitch of 500 μm, and the substrate is sent after the irradiation is performed 5 times. At the same time as sending the substrate, the positioning for making the centers of the circular patterns in the nucleus formation regions coincide with each other is carried out. The required accuracy here is about ±0.3 μm. The positioning accuracy of this level can be achieved by the following manner. That is, for example, patterns for positioning are formed on an insulating substrate (glass substrate), and a laser beam is detected by an interferometer. Using this positioning information, the substrate and the laser beam are positioned by, for example, positioner 104 in FIG. 4.

FIGS. 13A to 13D are plan views showing the state of polycrystalline silicon grains after each region is irradiated with baser beam. Although the state of the region 90 is not illustrated, the grain size of the silicon crystals is 0.3 μm.

Figure 13A:
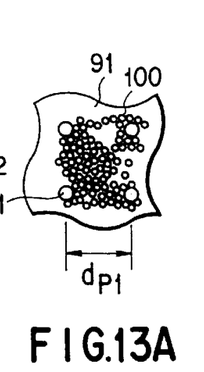
FIGS. 13A–13D are diagrams showing the states of crystal grains formed with use of masks 12B to 12E, respectively.

In the region 91, grains 101 having a large diameter of 1.5 μm are formed in accordance with a mask pattern C1, and in the surrounding portions of grains 101, crystals having a small diameter of 0.3 μm are randomly formed (see FIG. 13A).

Figure 13B:
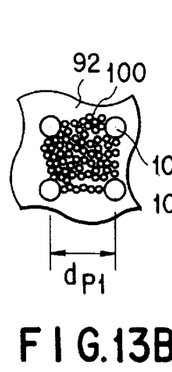

In the region 92, large-sized grains formed in the region grow to be grains 102 having a larger diameter of 2.5 μm, and in the surrounding portions of the grains 102, crystals having a small diameter of 0.3 μm are randomly formed (see FIG. 13B).

Figure 13C:
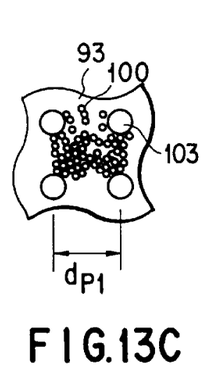
Figure 13D:
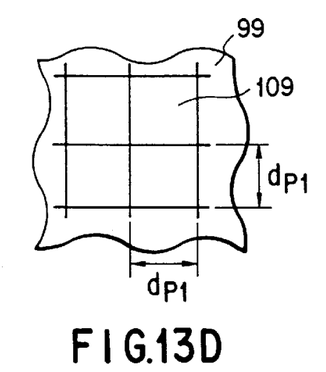

In the region 93, large-sized grains 103 are formed (see FIG. 13C). In this manner, the grain size increases step by step, and in the final region 99 (not shown in FIG. 12A, but in the outward of the left hand of FIG. 12A), grains 109 having a shape close to a square having a side of 10 μm are formed at a pitch of 10 μm (see FIG. 13D).

The time required to process a substrate having a size of 300×400 mm, is 200 seconds. In this embodiment, the pattern reduction irradiation is carried out; however it is alternatively possible to perform the proximity irradiation with patterns of the same magnification. However, in some cases, an initial nucleus shape cannot be obtained properly due to the lowering of the pattern accuracy, defects and the like, and therefore it is preferable that a plurality of blocks should be provided in the region 91.

In this mode, it becomes necessary to perform a highly accurate positioning of patterns, but at the same time, crystal grains of an arbitrary size can be formed. It should be noted that the shape of the patterns is not limited to circular, but they may be rectangular. In short, a polka dot pattern in which an opening is made at each intersection of a lattice, should be made. The number of times of irradiation, and the size of patterns in respective regions should be determined on the basis of the stability of laser output and the uniformity of crystal grains. Thus, these values are not limited to those used in this embodiment.

(Fifth Embodiment)

Figure 14A:
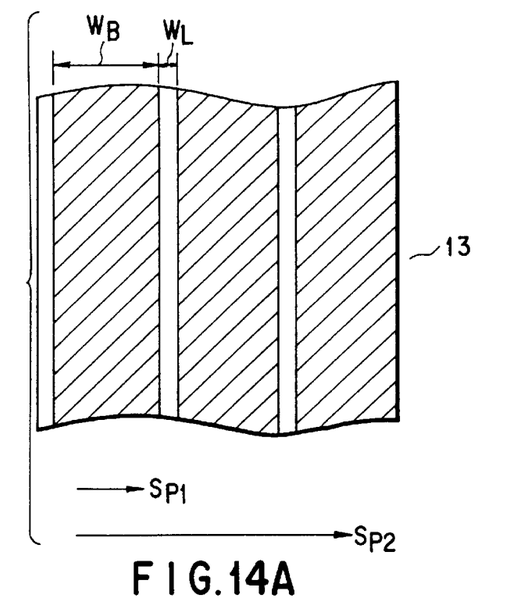
FIG. 14A is a plan view showing a part of a mask used in the method of manufacturing a polycrystalline silicon thin film, according to the fifth embodiment of the present invention.
Figure 14B:
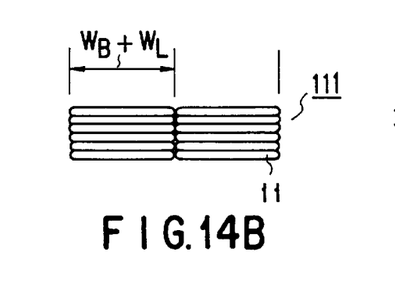
FIG. 14B is a plan view showing the shape of crystal grains formed in the fifth embodiment.
Figure 14C:
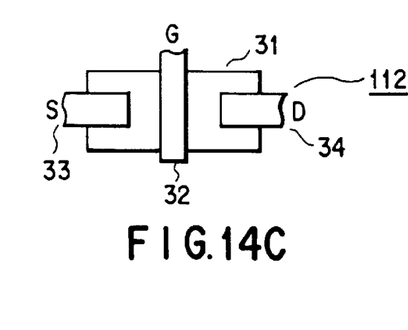
FIG. 14C is a plan view of a transistor, designed to illustrate the direction in which a thin film transistor made of silicon thin film manufactured in the fifth embodiment is formed.

FIGS. 14A to 14C are diagrams illustrating the method of manufacturing a polycrystalline silicon thin film, according to the fifth embodiment of the present invention.

In the fifth embodiment, the pattern of the mask 13 is made of stripes having light blocking regions (width WB=5 $\mu$m) and light transmitting regions (width WL=1 $\mu$m), which are alternately arranged (see FIG. 14A). In this embodiment, a substrate is sent at a pitch (Sp1) of 0.5 $\mu$m every 3 times that irradiation of the laser beam is performed. The laser beam has a length of 100 mm and a width of 500 $\mu$m, and the above-described stripe pattern is repeated over the regions corresponding to the laser beam width (500 $\mu$m). In the case where the total of the portions of the substrate sent exceeds the width WB of the light blocking region, that is, 5 $\mu$m, the substrate is sent by a laser beam width, 500 $\mu$m (Sp2).

It should be noted that it is preferable that small-sized crystal grains should be formed in advance in the silicon layer on the substrate, by the conventional method. In the fifth embodiment, the time required for processing the entire surface of a substrate (300×400 mm) is 240 seconds.

FIG. 14B is a plan view of crystals 111 obtained with the mask shown in FIG. 14A. As shown, the crystal grains each having a length of 7 $\mu$m and a width of 0.3 $\mu$m can be obtained. In the fifth embodiment, as shown in FIG. 14C, the channel direction (current flowing direction) of a TFT 112 is set in the substrate sending direction, and thus a mobility of twice as high as that of a TFT disposed in the vertical direction thereto, that is 250 (cm$^2$/Vs), can be obtained. The channel length of the TFT in this case is 5 $\mu$m and the width thereof is 3 $\mu$m.

(Sixth Embodiment)

Figure 15A:
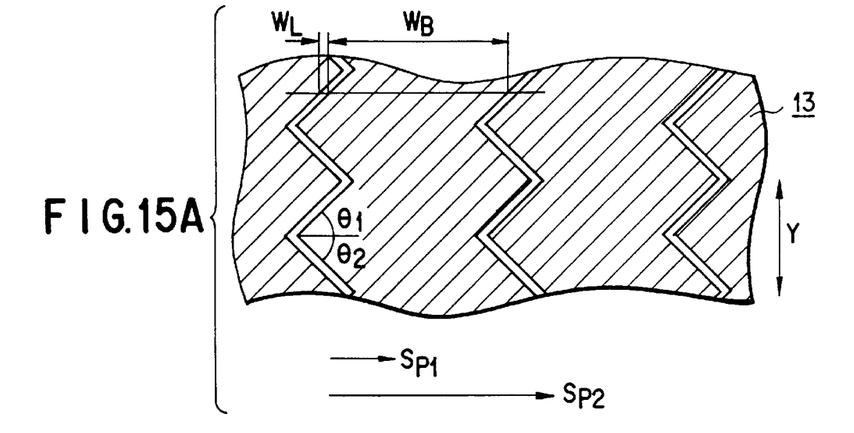
FIG. 15A is a plan view showing a part of a mask used in the method of manufacturing a polycrystalline silicon thin film, according to the sixth embodiment of the present invention.
Figures 15B, 15C:
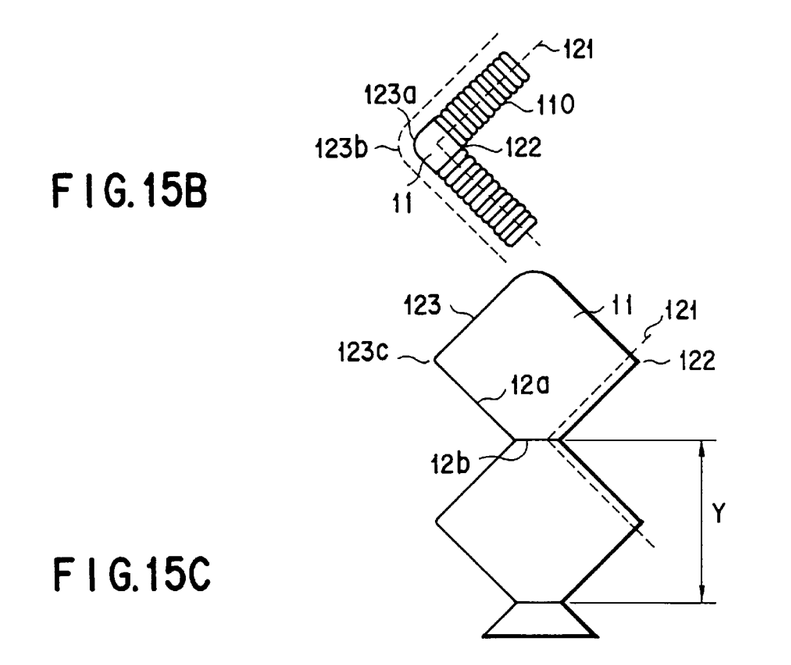
FIGS. 15B to 15D are diagrams illustrating, step by step, the growth steps of crystal grains in the sixth embodiment.

FIGS. 15A to 15C are diagrams illustrating the method of manufacturing a polycrystalline silicon thin film, according to the sixth embodiment of the present invention.

In the sixth embodiment, the mask 13 has a zigzag mask pattern for the laser beam transmission regions, as can be seen in FIG. 15A. The width WI of the light transmitting region is 3 $\mu$m, the width WB for light blocking region is 10 $\mu$m and the pitch Y of the zigzags is 6 $\mu$m. Angles θ1 and θ2 of the zigzag pattern, made with respect to the substrate scanning direction are both 45 degrees. The laser beam has a length of 100 mm and a width ($W_{ELA}$) of 500 $\mu$m, and the mask pattern is formed repeatedly over 500 $\mu$m, which is the same as the beam width.

In the sixth embodiment, after the laser beam is irradiated for three times, the substrate is sent at a pitch (Sp1) of 0.8 $\mu$m. This operation is repeated until the total distance of the substrate sent becomes (Wb+Y). In this case, the operation is repeated until the total distance of the substrate sent becomes (10+6) 16 $\mu$m. That is, the number of times of sending is 20, and the number of times of irradiation during this period is (20×3=) 60. After a while, the substrate is sent at a pitch (Sp2) which corresponds to the mask pattern width (beam width), 500 $\mu$m, and the same irradiation is repeated. The laser oscillation frequency is 300 Hz, and the time required for treating the entire surface of the substrate having a size of 300×400 mm, is 160 seconds.

Figure 15D:
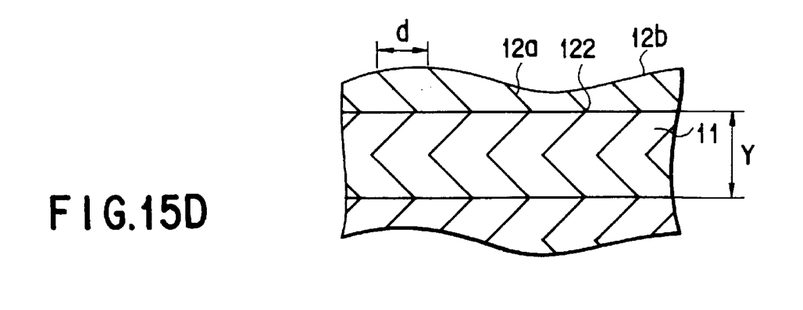

The shapes of the crystal grains obtained in the sixth embodiment are shown in FIGS. 15B to 15D. FIG. 15B shows the shape of crystal grains obtained by the first irradiation of light. At a peak 123a of the zigzag pattern, a rectangular crystal grain having sides of about 2 $\mu$m and a round corner is obtained. In an oblique pattern region, slender crystal grains 110 arranged along the mask pattern and each having a length of 2 $\mu$m and a width of 0.3 $\mu$m.

In the case where the laser radiation is carried out after sending the substrate (at a pitch of Sp1) for the first time, the crystal grains grow to the position indicated by a peak 123b in FIG. 15B; however the crystal grain located at the peak continues to grow from the position indicated by numeral 122, thus forming a shape close to a rectangle.

FIG. 15C shows a state in which crystals are further grown. Another peak which is located opposite to the peak 122 grows to the position indicated by reference numeral 123c, and this peak 123c is brought into contact with a crystal grain which starts from a bottom of the zigzag pattern, adjacent thereto, in a grain boundary 12b. Although the section which actually moves as the crystal grows is the side 123, this figure shows that the peak 123a grows to a section indicated by reference numeral 123c.

The final state is shown in FIG. 15D, in which grains each having a laid-down V shape (that is,>) having a width (d) of WB+WL (13 $\mu$m) and a length of Y (6 $\mu$m).

In the fifth embodiment, the angle θ is set to 45 degrees; however the present invention is not limited to this angle. It should be noted that the total distance sent for the substrate at a scan Sp is increased as the angle becomes closer to 0 or 90 degrees, and therefore it is practically preferable that the angle θ should be in a range of 20 to 70 degrees.

(Seventh Embodiment)

Figure 16A:
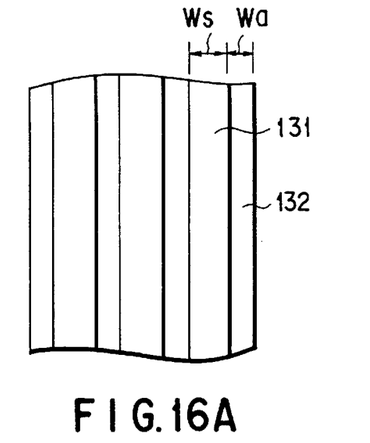
FIG. 16A is a plan view showing a part of a mask used in the method of manufacturing a polycrystalline silicon thin film, according to the seventh embodiment of the present invention.
Figure 16B:
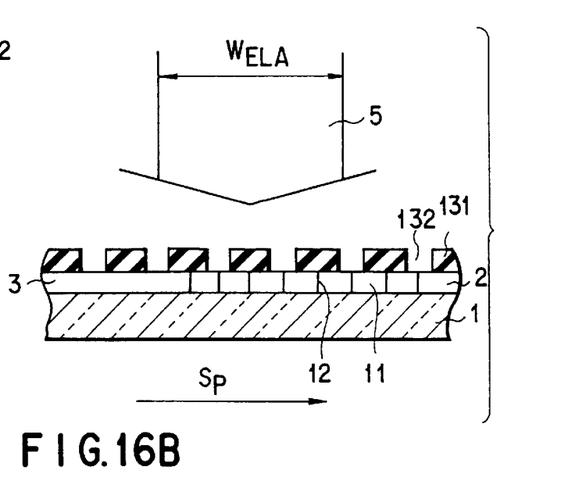
FIG. 16B is a cross sectional view of a thin film carrying substrate, designed to illustrate the method of growing crystal grains, according to the seventh embodiment.
Figure 16C:
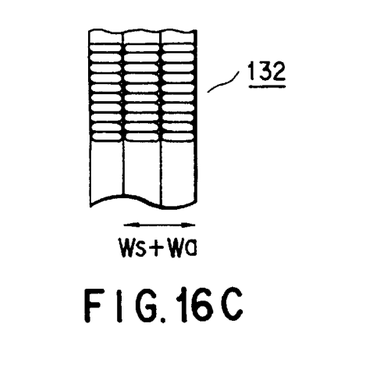
FIG. 16C is a plan view illustrating crystal grains of a polycrystalline silicon thin film according to the seventh embodiment.

FIGS. 16A to 16C are diagrams illustrating the method of manufacturing a polycrystalline silicon thin film, according to the seventh embodiment of the present invention.

In the seventh embodiment, a silicon oxide film formed on the surface of the silicon thin film is used as a mask for the irradiation of a laser beam.

First, a silicon oxide film having a thickness of 100 nm is formed on an amorphous silicon thin film having a thickness of 50 nm, formed on a glass substrate. After that, as can be seen in FIG. 16A, a silicon oxide film 132 and a pattern space 131 are patterned to have widths of Wa and Ws, respectively.

Next, as can be seen in FIG. 16B, a laser beam having a beam width of $W_{ELA}$ is irradiated on the substrate. The oxide film itself transmits an excimer laser beam (an XeCl laser in this embodiment). In this embodiment, the heat radiation state of the energy absorbed in the silicon thin film differs depending upon whether or not an oxide film pattern is present. That is, the heat conductivity of the portion of the silicon layer, which is covered by the oxide film is higher, and therefore the temperature of the portion drops quickly. Taking advantage of such characteristics, a temperature gradient is created within the surface of the silicon thin film.

In the seventh embodiment, the width Wa of the oxide film is 1.5 $\mu$m and the space of the oxide film pattern is 1 $\mu$m. This pattern is formed on the entire surface of the substrate having a size of 300×400 mm. The laser beam used here has a length of 200 mm and a width $W_{ELA}$ of 300 $\mu$m. The laser is oscillated at 300 Hz, and the substrate is sent at a pitch Sp (15 $\mu$m) each time a laser beam is irradiated. The time required to treat the entire surface of the substrate is 130 seconds.

The state of grains is shown in FIG. 16C. The dimensions of the grains are 1 to 1.5 $\mu$m in the scanning direction of the substrate, and 0.3 $\mu$m in the direction vertical to the scanning direction. The oxide film 131 should be removed by etching after the laser annealing is carried out. In order to achieve a uniformity of grain size, it is preferable that Wa and Ws should be set to 3 $\mu$m or less as in the case of the first embodiment. However, the TFT characteristics can be still improved when crystals having large sizes are present even partially in the channel region of the TFT, and therefore some effect can be expected when Wa and Ws are about 10 $\mu$m or less.

Especially, the oxide film transmits the laser means and therefore silicon present underneath the oxide film can be crystallized after being melted. For this reason, it is not particularly necessary to reduce the width Wa of the oxide film. However, it is preferable that the channel direction of the TFT should be set to the direction vertical to the stripe pattern.

In general, the channel direction of the TFT is parallel or vertical to the longitudinal direction of the substrate, and it is practically difficult to set it in one direction. In this case, the direction of the stripe pattern should be inclined with respect to the longitudinal direction of the substrate by an angle of $\theta$, and thus the characteristics of obtained TFTs can be made uniform even the patterns are arranged in any directions. A practical range of the angle $\theta$ is 30 to 60 degrees, and in this range, the problem in terms of the anisotropy in the TFT characteristics due to the pattern direction would not occur.

It should be noted that the present invention is not limited to the embodiments described above. For example, the laser beam may not necessarily be a lengthy laser beam, but may be of a rectangular shape. Further, although it is not mentioned in the embodiments, the atmosphere of the laser beam irradiation may be in a vacuum state, a nitrogen state or an air state. Furthermore, it is not necessary to heat the glass substrate; however it is true that the time for crystallization can be prolonged by heating the substrate, which is advantageous to improve the size of the crystal grains.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a polycrystalline semiconductor thin film, comprising the steps of:

forming an amorphous semiconductor thin film on an insulating substrate;

irradiating an energy beam of a pulse form on a first region of the amorphous semiconductor thin film, via a mask in which energy beam transmitting portions are formed as a plurality of patterns on a transparent plate, so as to selectively convert the amorphous semiconductor thin film into a polycrystalline semiconductor thin film, the energy beam of the pulse form being one of repetitive pulse beams having a preset interval; and changing a region on which the energy beam is irradiated from the first region to a second region having an overlapping portion with the first region on the amorphous semiconductor thin film after the step of irradiating the energy beam on the first region.

2. The of manufacturing a polycrystalline semiconductor thin film, according to claim 1, wherein the step of irradiating the energy beam on the first region of the amorphous semiconductor thin film, includes a step of irradiating the energy beam via the mask in which repetitious patterns of stripes are formed.

3. The method of manufacturing a polycrystalline semiconductor thin film, according to claim 2, wherein the step of irradiating the energy beam includes a first step of irradiating the energy beam a plurality of times, and the step of changing the region on which the energy beam is irradiated, includes a second step of moving the substrate by a first pitch.

4. The method of manufacturing a polycrystalline semiconductor thin film, according to claim 3, further comprising a third step of moving the substrate at a second pitch, after the first step and the second step are repeated a plurality of times.

5. The method of manufacturing a polycrystalline semiconductor film, according to claim 4, wherein the second pitch is larger than the first pitch.

6. The method of manufacturing a polycrystalline semiconductor thin film, according to claim 3, wherein the second step includes a step of moving the substrate in a direction substantially vertical to a direction of the stripes.

7. The method of manufacturing a polycrystalline semiconductor film, according to claim 3, wherein the first region has a rectangular form and the first pitch is smaller than a length of a shorter side of the first region.

8. The method of manufacturing a polycrystalline semiconductor film, according to claims 3, wherein the repetitious patterns of stripes are formed in the first region in parallel with a longer side thereof, and the first pitch is larger than a repetitious pitch of the repetitious patterns of stripes.

9. The method of manufacturing a polycrystalline semiconductor thin film, according to claim 1, wherein the step of irradiating the energy beam onto the amorphous semiconductor thin film, includes a step of using the mask in which said plurality of patterns are respectively assigned to a plurality of regions and different patterns are formed respectively in the plurality of regions.

10. The method of manufacturing a polycrystalline semiconductor thin film, according to claim 9, wherein the step of irradiating the energy beam on the amorphous semiconductor thin film includes a first step of irradiating the first region using one of the plurality of patterns formed respectively in the plurality of regions;

the step of changing the region on which the energy beam is irradiated includes a second step of moving the substrate by a predetermined distance such that the first region is irradiated via another pattern adjacent to the one of the plurality of patterns, and wherein the first step and the second step are repeated so as to irradiate the energy beam on the first region of the amorphous semiconductor thin film via each of the plurality of patterns.

11. The method of manufacturing a polycrystalline semiconductor thin film, according to claim 10, wherein the plurality of patterns assigned to the plurality of regions include repetitious patterns, respectively, and the repetitious patterns are set in different directions between at least two regions of the plurality of regions.

12. The method of manufacturing a polycrystalline semiconductor thin film, according to claim 10, wherein the plurality of patterns assigned to the plurality of regions have a plurality of openings formed at a predetermined pitch common to the plurality of regions, the plurality of openings having substantially the same size in each of the plurality of regions, and being of similar patterns of different sizes among the plurality of regions; and the second step of moving the substrate by the predetermined distance, includes a step of moving the substrate at the predetermined common pitch such that the similar patterns of different sizes in the plurality of regions are aligned with each other in an increasing order of the size.

13. The method of manufacturing a polycrystalline semiconductor thin film, according to claim 12, wherein the plurality of patterns assigned to the plurality of regions form a polka dot pattern in which the plurality of openings are arranged at intersections of a lattice.

14. The method of manufacturing a polycrystalline semiconductor thin film, according to claim 1, wherein the step of irradiating the energy beam on the first region of the amorphous semiconductor thin film, includes a step of irradiating the energy beam via a mask in which zigzag repetitious patterns are formed.

15. The method of manufacturing a polycrystalline semiconductor thin film, according to claim 14, wherein the step of irradiating the energy beam includes a first step of irradiating the energy beam a plurality of times, and the step of changing the region on which the energy beam is irradiated, includes a second step of moving the substrate by a first pitch.

16. The method of manufacturing a polycrystalline semiconductor thin film, according to claim 15, further comprising a third step of moving the substrate at a second pitch, after the first step and the second step are repeated a plurality of times.

17. The method of manufacturing a polycrystalline semiconductor thin film, according to claim 1, wherein the step of irradiating the energy beam onto the first region of the amorphous semiconductor thin film, includes a step of irradiating the energy beam, using repetitious patterns of stripes made of a transparent inorganic material and formed on the semiconductor thin film, as a mask.

18. The method of manufacturing a polycrystalline semiconductor thin film, according to claim 17, wherein the step of irradiating the energy beam includes a first step of irradiating the energy beam a plurality of times, and the step of changing the region on which the energy beam is irradiated, includes a second step of moving the substrate by a first pitch.

* * * * *